United States Patent
Zhang et al.

(10) Patent No.: US 8,862,961 B2
(45) Date of Patent: Oct. 14, 2014

(54) LDPC DECODER WITH DYNAMIC GRAPH MODIFICATION

(71) Applicants: Fan Zhang, Milpitas, CA (US); Shaohua Yang, San Jose, CA (US); Ming Jin, Fremont, CA (US)

(72) Inventors: Fan Zhang, Milpitas, CA (US); Shaohua Yang, San Jose, CA (US); Ming Jin, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 86 days.

(21) Appl. No.: 13/622,284

(22) Filed: Sep. 18, 2012

(65) Prior Publication Data
US 2014/0082448 A1 Mar. 20, 2014

(51) Int. Cl.
*H03M 13/00* (2006.01)

(52) U.S. Cl.
USPC .............. 714/758; 714/752; 714/755

(58) Field of Classification Search
CPC ........ H03M 13/1102; H03M 13/1105; H03M 13/1108; H03M 13/1111; H03M 13/1114; H03M 13/1117; H03M 13/112; H03M 13/1122; H03M 13/1125; H03M 13/1128; H03M 13/1131; H03M 13/1177
USPC .......................... 714/752, 755, 758
See application file for complete search history.

(56) References Cited

U.S. PATENT DOCUMENTS

| | | | |
|---|---|---|---|
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling et al. | |
| 7,136,244 B1 | 11/2006 | Rothberg | |
| 7,730,384 B2 | 6/2010 | Graef et al. | |
| 7,738,201 B2 | 6/2010 | Jin et al. | |
| 2003/0014718 A1* | 1/2003 | De Souza et al. | 714/804 |
| 2008/0148128 A1* | 6/2008 | Sharon et al. | 714/758 |
| 2010/0153811 A1* | 6/2010 | Kwon et al. | 714/752 |
| 2010/0257425 A1* | 10/2010 | Yue et al. | 714/752 |
| 2011/0295786 A1* | 12/2011 | Reynolds et al. | 706/46 |
| 2014/0019824 A1* | 1/2014 | Varanasi | 714/758 |

OTHER PUBLICATIONS

Olmos et al., "Tree-Structure Expectation Propagation for LDPC Decoding in Erasure Channels", Cornell University Library arXiv:1009.4287 (Sep. 22, 2010).

* cited by examiner

*Primary Examiner* — Sam Rizk
(74) *Attorney, Agent, or Firm* — Hamilton DeSanctis & Cha

(57) ABSTRACT

The present inventions are related to systems and methods for an LDPC decoder with dynamic Tanner graph modification, and in particular, to a non-erasure channel LDPC decoder that implements a probabilistic approach to Tanner graph modification.

20 Claims, 5 Drawing Sheets

LDPC DECODER WITH DYNAMIC GRAPH MODIFICATION

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

The parity bit may also be used in error correction systems, including in Low Density Parity Check (LDPC) decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. The connections (or edges) between variable nodes 110-124 and check nodes 102-108 are selected as the LDPC code is designed, balancing the strength of the code against the complexity of the decoder required to execute the LDPC code as data is obtained. The number and placement of parity bits in the group are selected as the LDPC code is designed. Messages are passed between connected variable nodes 110-124 and check nodes 102-108 in an iterative process, passing beliefs about the values that should appear in variable nodes 110-124 to connected check nodes 102-108. Parity checks are performed in the check nodes 102-108 based on the messages and the results are returned to connected variable nodes 110-124 to update the beliefs if necessary. LDPC decoders may be implemented in binary or non-binary fashion. In a binary LDPC decoder, variable nodes 110-124 contain scalar values based on a group of data and parity bits that are retrieved from a storage device, received by a transmission system or obtained in some other way. Messages in the binary LDPC decoders are scalar values transmitted as plain-likelihood probability values or log-likelihood-ratio (LLR) values representing the probability that the sending variable node contains a particular value. In a non-binary LDPC decoder, variable nodes 110-124 contain symbols from a Galois Field, a finite field $GF(p^k)$ that contains a finite number of elements, characterized by size $p^k$ where p is a prime number and k is a positive integer. Messages in the non-binary LDPC decoders are multi-dimensional vectors, generally either plain-likelihood probability vectors or LLR vectors.

The connections between variable nodes 110-124 and check nodes 102-108 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} a(1,1) & 0 & 0 & a(1,2) & 0 & a(1,3) & a(1,4) & 0 \\ 0 & a(2,1) & 0 & 0 & a(2,2) & 0 & 0 & a(2,3) \\ a(3,1) & 0 & a(3,2) & 0 & a(3,3) & a(3,4) & 0 & a(3,5) \\ 0 & a(4,1) & 0 & a(4,2) & 0 & 0 & a(4,3) & a(4,4) \end{bmatrix}$$

By providing multiple check nodes 102-108 for the group of variable nodes 110-124, redundancy in error checking is provided, enabling errors to be corrected as well as detected. Each check node 102-108 performs a parity check on bits or symbols passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 110-124 and check nodes 102-108, with the values in the nodes 102-124 being adjusted based on the messages that are passed, until the values converge and stop changing or until processing is halted.

The LDPC code (or matrix) is carefully designed to provide good error detection and correction for expected channel conditions, while using a small number of parity bits. However, trapping sets, or groups of variable nodes in which errors can be trapped, may exist in LDPC codes, reducing the likelihood of successful decoding.

BRIEF SUMMARY

The present inventions are related to systems and methods for an LDPC decoder with dynamic Tanner graph modification, and in particular, to a non-erasure channel LDPC decoder that implements a probabilistic approach to Tanner graph modification. In some embodiments, the Tanner graph is dynamically modified when a trapping set is detected. Single-edge check nodes in a trapping set are first removed from the Tanner graph in some embodiments, setting the values of variable nodes connected to single-edge check nodes to zero. The Tanner graph is modified by identifying a double-edge check node, a check node with a double connection to variable nodes in the trapping set, and by removing all connections to one of the variable nodes connected to the identified double-edge check node to remove it from the Tanner graph. This change is compensated for with a new connection between a variable node and check node in the trapping set. In a non-binary LDPC decoder, the edge weight of the new connection is based at least in part on edge weights of connections to the isolated variable node and to the check node first identified, thereby applying a probabilistic approach to on-the-fly Tanner graph modification. Normal decoding can then continue with the Tanner graph dynamically modified to disrupt the trapping set. If another trapping set is encountered, the process may be repeated. At or near the end of decoding, the value of the isolated and removed variable nodes may be calculated, as well as the values of variable nodes that are partially dependent on the value of the isolated and removed variable nodes.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification.

DETAILED DESCRIPTION OF THE INVENTION

The present inventions are related to systems and methods for an LDPC decoder with dynamic Tanner graph modification, and in particular, to a non-erasure channel LDPC decoder that implements a probabilistic approach to Tanner graph modification. The LDPC decoder used in various embodiments may be any type of LDPC decoder, including binary and non-binary, layered and non-layered. LDPC technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In some embodiments, the Tanner graph is dynamically modified when a trapping set is detected, although it may be applied to any group of variable nodes and check nodes in a Tanner graph and at any occasion. A trapping set is defined herein as a group of variable nodes and check nodes forming a subset of those in a Tanner graph where decoding fails to converge or gets stuck. Decoding can have a massive failure in which the number of unsatisfied parity checks is large, typically caused by poor signal to noise ratio (SNR), or with a mid-size failure due to clusters of interconnected trapping sets, or with a small failure with isolated trapping sets. In the latter two cases with trapping set failures, if the trapping sets can be identified, dynamic graph modification as disclosed herein can be used to alter the Tanner graph and H matrix for the LDPC code, disrupting the trapping set and allowing normal processing to continue.

Figure 2:
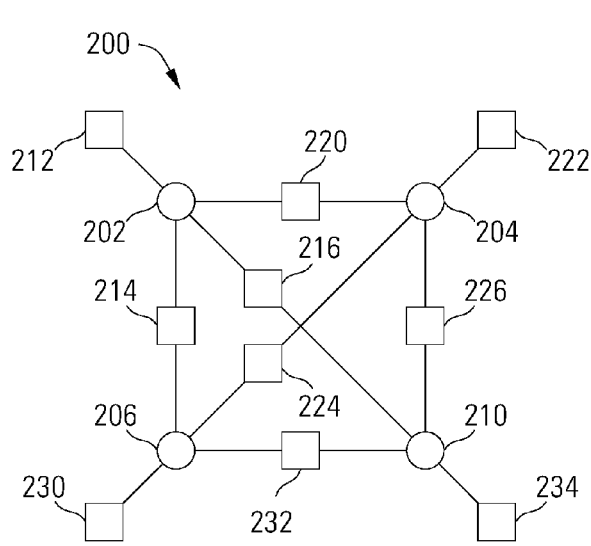
FIG. 2 depicts an example trapping set in an LDPC code.

Turning to FIG. 2, a simple trapping set 200 in an LDPC code is depicted to illustrate how errors can be trapped during decoding. (Note that the number of connected variable nodes and check nodes, and the number of connections for each variable node and check node, is merely an example and may not be applicable to every LDPC code or every LCPD decoder.) The example trapping set 200 includes four variable nodes 202, 204, 206 and 210. Variable node 202 is connected to four check nodes 212, 214, 216 and 220. Variable node 204 is connected to four check nodes 220, 222, 224 and 226. Variable node 206 is connected to four check nodes 214, 224, 230 and 232. Variable node 210 is connected to four check nodes 216, 226, 232 and 234.

Variable nodes 202, 204, 206 and 210 form a trapping set 200. If all four variable nodes 202, 204, 206 and 210 have errors in their bit or symbol values, these errors will tend to be trapped. Check nodes 214, 216, 220, 224, 226 and 232 are connected only to variable nodes 202, 204, 206 and 210 within the trapping set 200. The parity checks performed by these check nodes 214, 216, 220, 224, 226 and 232 may pass even if the values in the variable nodes 202, 204, 206 and 210 are incorrect. For example, if both variable nodes 202 and 206 contain erroneous bit values of 0 instead of correct bit values of 1, the parity check performed in check node 214 will pass because both inputs from variable nodes 202 and 206 are incorrect. Similarly, if both variable nodes 202 and 210 contain incorrect values, the parity check performed in check node 216 will pass.

If majority rules voting or similar systems are used to reconcile the parity checks for a particular variable node in the trapping set 200, the error is trapped rather than corrected. For example, if check nodes 214, 224 and 232 all incorrectly report that variable node 206 contains the correct data value, the variable node 206 will maintain the incorrect data value, even if check node 230 reports that it is an error based on other variable nodes (not shown) that are connected to check node 230. In other words, even if the parity check performed in check node 230 fails because the error in variable node 206 does not combine with values from other variable nodes (not shown) connected to check node 230 to pass the parity check, the error report from check node 230 will be overruled by the mistaken reports from check nodes 214, 224 and 232 indicating that variable node 206 is correct.

A trapping set may be identified in any suitable manner, for example using an algorithm as disclosed in U.S. patent application Ser. No. 13/602,440, filed Sep. 4, 2012 for "LDPC Decoder Trapping Set Identification", which is incorporated herein for all purposes.

The dynamic graph modification disclosed herein applies a probabilistic approach that is particularly beneficial in non-erasure channel LDPC decoders, although it may also be applied in erasure channel LDPC decoders. In an erasure channel LDPC decoder implementing a belief propagation or peeling algorithm, variable nodes are removed from the Tanner graph during decoding as they are identified as being correct. If a check node is connected to only one variable node, the variable node value must be 0 because the check node must be 0 to satisfy the parity check, allowing the variable node can be removed from the Tanner graph. The Tanner graph is thus naturally reduced during decoding, and when all variable nodes have been removed, leaving an empty Tanner graph, decoding is successful. If, however, during decoding a point is reached at which no more variable nodes can be identified as correct and removed, the decoding has failed to converge and the remaining variable nodes form a trapping set.

In a non-erasure channel (e.g., AWGN, PR, q-SC, etc.) LDPC decoder, the Tanner graph is not changed during normal decoding. No variable nodes are removed as they are identified as correct. Only messages in the decoder are changed, and the Tanner graph remains fixed. Generally, decoding continues until all parity checks are satisfied or until the limit on the maximum number of local decoding iterations has been reached. However, if during decoding a set of variable nodes remains and none can be identified as correct and removed, the set is a trapping set and decoding cannot continue normally to convergence. By modifying the Tanner graph, the trapping set can be changed so that normal decoding can continue.

The Tanner graph is first modified by identifying any check nodes in the trapping set with single edges or connections. Because the check node is connected to only one variable node, the value of that variable node must be zero. The value of the variable node is therefore set to zero, and the connection between the check node and variable node is removed in the Tanner graph, thereby removing the single-edge check node from the Tanner graph.

When there are no single-edge check nodes remaining in the trapping set, the trapping set is disrupted by removing a variable node in the trapping set connected to a double-edge check node in the trapping set and compensating for the removal by adding a different connection. The edge weight of the new connection is based at least in part on edge weights of connections to the isolated variable node and to the double-edge check node first identified, thereby applying a probabilistic approach to on-the-fly Tanner graph modification. Normal decoding may then proceed with the trapping set disrupted. If a new trapping set is identified, the process may be repeated. At or near the end of decoding, the values of the variable nodes that were connected to double-edge check nodes and were removed by the graph modification, as well as variable nodes whose values depend on the removed variable nodes, are calculated. The values are calculated based on the decoded values of other connected variable nodes.

Figure 3A:
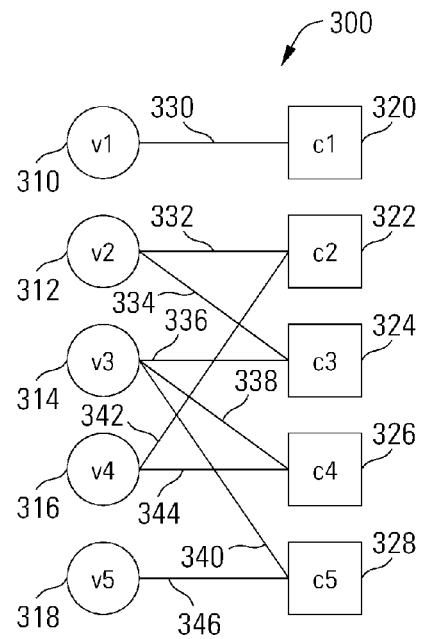
FIGS. 3A-3C depict a trapping set in the Tanner graph of an LDPC code during three stages of dynamic graph modification in accordance with some embodiments of the present inventions.
Figure 3B:
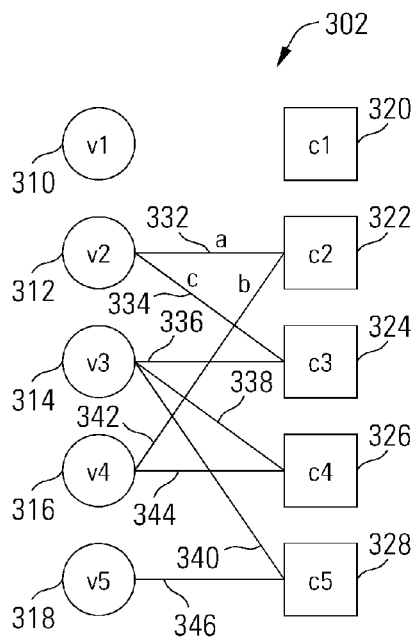
Figure 3C:
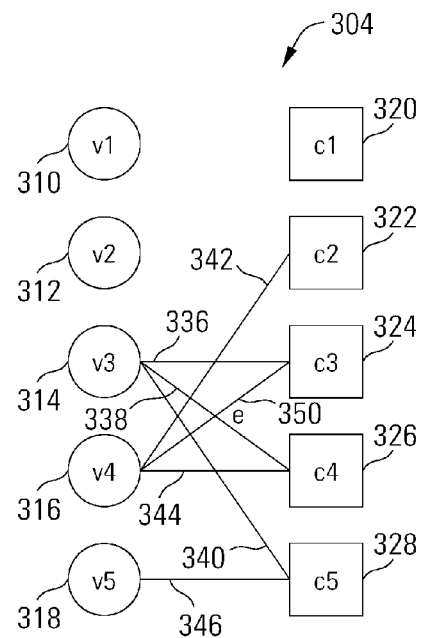

Turning to FIGS. 3A-3C, an example of the dynamic graph modification in a non-binary LDPC decoder is presented. In the first stage of dynamic graph modification, a trapping set 300 in a portion of a Tanner graph for an LDPC code is identified in any suitable manner. In this example, trapping set 300 includes variable nodes 310-318 and check nodes 320-328. Variable node 310 is connected to check node 320 by edge 330. Variable node 312 is connected to check node 322 by edge 332 and to check node 324 by edge 334. Variable node 314 is connected to check node 324 by edge 336, to check node 326 by edge 338, and to check node 328 by edge 340. Variable node 316 is connected to check node 322 by edge 342 and to check node 326 by edge 344. Variable node 318 is connected to check node 328 by edge 346.

In the second stage of dynamic graph modification in some example embodiments, single-edge check nodes are identified and removed from the trapping set 300. In some LDPC decoder embodiments, check nodes verify that the values of the connected variable nodes, each multiplied by their corresponding edge weights, sum to zero to pass the parity check calculation in the check node. In these embodiments, if a check node is connected to only one variable node, the value of that variable node must be zero to pass the parity check. Thus, the value of variable nodes connected to single-edge check nodes are set to zero and the connection between the single-edge check nodes and corresponding variable nodes are deleted, removing the single-edge check nodes and corresponding variable nodes from the Tanner graph. For example, check node 320 is a single-edge check node, connected only to variable node 310 by edge 330. The value (or hard decision) of variable node 310 is therefore set to zero, and as shown in FIG. 3B, the edge 330 is deleted, isolating variable node 310 and check node 320 and effectively removing them from the modified Tanner graph 302.

In the third stage of dynamic graph modification in some example embodiments, once all single-edge check nodes and their corresponding variable nodes have been removed, a double-edge check node is identified in the Tanner graph 302 for removal. Any double-edge check node may be selected as a target check node for removal. For example, check node 322 is a double-edge check node, being connected to variable node 312 by edge 332 and to variable node 316 by edge 342 and is selected in this example as the target check node. One of the variable nodes 312 or 316 connected to the target check node 322 is selected for removal, for example variable node 312, yielding a selected variable node 312 and a remaining variable node 316. When selected variable node 312 is removed from the Tanner graph 302, target check node 322 will be isolated and thus removed from the Tanner graph 302 as well, and the variable node connections or edges between non-target check node 324 and selected variable node 312 will be lost. A new connection or edge will be added to non-target check node 324 to compensate for the lost edge 334 so that the parity check equation of non-target check node 324 is equivalent before and after the modification.

The edge weight of edge 322 between selected variable node 312 and target check node 322 is designated herein as edge weight a. The edge weight of edge 342 between target check node 322 and remaining variable node 316 is designated herein as edge weight b. The edge weight of edge 334 between selected variable node 312 and non-target check node 324 is designated herein as edge weight c.

In the partially modified Tanner graph 302, the parity check equation for target check node 322 is $V2*e22+V4*e42=0$, where V2 is the value or hard decision of selected variable node 312, e22 is the edge weight a of edge 322 between selected variable node 312 and target check node 322, V4 is the value of remaining variable node 316, and e42 is the edge weight b of edge 342 between target check node 322 and remaining variable node 316. The parity check equation for non-target check node 324 is $V2*e23+V3*e33=0$, where V2 is the value or hard decision of selected variable node 312, e23 is the edge weight c of edge 334 between selected variable node 312 and non-target check node 324, V3 is the value of variable node 314, and e33 is the edge weight of edge 336 between variable node 314 and non-target check node 324.

Selected variable node 312 is removed from the partially modified Tanner graph 302 by deleting edges 332 and 334. When selected variable node is removed from the partially modified Tanner graph 302, its value V2 will not be available for the parity check equations of connected check nodes 322 and 324, or when calculating values of variable nodes such as variable node 316. For example, consider the value V2 of selected variable node 312 to be unknown value x. When selected variable node 312 is removed from the partially modified Tanner graph 302, the unknown value x is passed to remaining variable node 316 through the parity check constraint on target check node 322. At or near the end of decoding, after the trapping set has been overcome and remaining data has converged, the unknown value x of selected variable node 312 can be calculated, as well as the values of other variable nodes whose values depended on selected variable node 312, such as remaining variable node 316. When the value V2 of selected variable node 312 is set to unknown value x, the parity check equation for non-target check node 324 changes from $V2*e23+V3*e33=0$ to $x*e23+V3*e33=0$, and with value x unavailable when e23 is removed, the parity check equation for non-target check node 324 cannot be solved.

A new edge 350 between remaining variable node 316 and non-target check node 324 is added to the modified Tanner graph 304 as shown in FIG. 3C to compensate for the removal of edges 332 and 334. This adds the value of remaining variable node 316 to the parity check equation for non-target check node 324, restoring the effect of unknown value x on non-target check node 324 so that it can be solved in terms of x, with the value of x to be calculated and provided later in decoding. The parity check equation for non-target check node 324 is thus changed from $x*e23+V3*e33=0$ to $V4*e43+V3*e33=0$, where V4 is the value of remaining variable node 316, e43 is the edge weight e of new edge 350 between remaining variable node 316 and non-target check node 324, V3 is the value of variable node 314, and e33 is the edge weight of edge 336 between variable node 314 and non-target check node 324. The edge weight e of new edge 350 is $e=b*c/a$, thus basing the edge weight e of new edge 350 at least in part on the edge weights a, b and c of edges 332, 342 and 334 connected to selected variable node 312 and to target check node 322. Notably, the modified Tanner graph 304 is equivalent to partially modified Tanner graph 302.

The Tanner graph is thus modified to disrupt the trapping set 300, enabling normal decoding to continue. Although calculation of the value or hard decision of removed variable nodes is deferred until later in decoding, the dynamic graph modification disrupts the trapping set by solving the voting problems due to the trapping set. With the Tanner graph modified, normal decoding is continued. If another trapping set is detected, the process may be repeated to dynamically modify the Tanner graph again to disrupt the newly detected trapping set.

Figure 4:
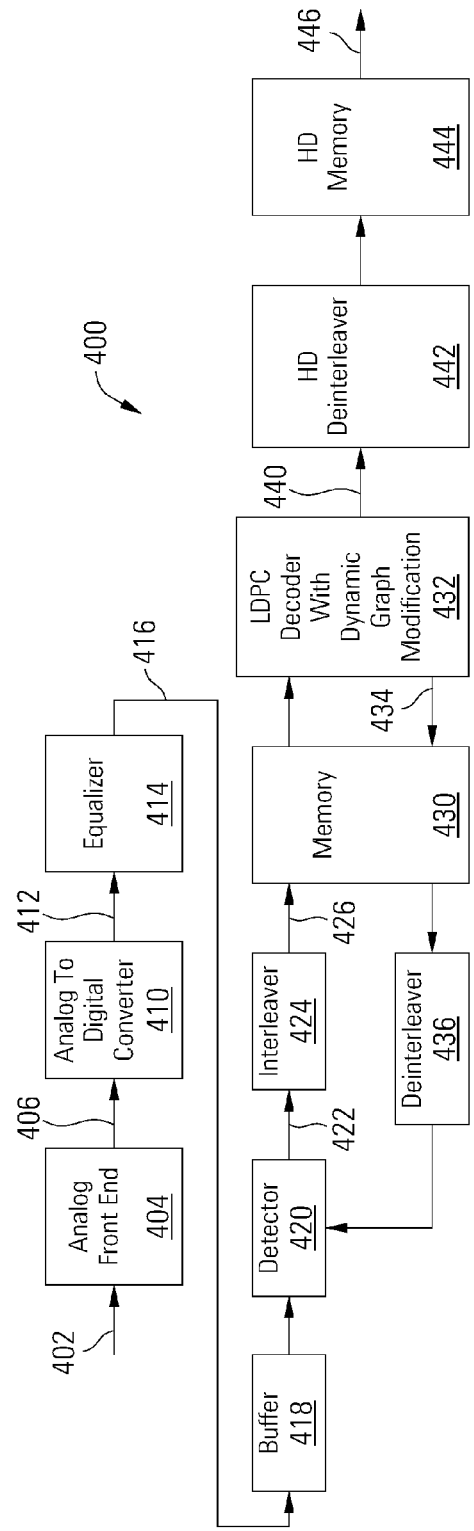
FIG. 4 depicts a read channel for a hard disk drive, incorporating an LDPC decoder with dynamic graph modification in accordance with some embodiments of the present inventions.

Turning to FIG. 4, a read channel 400 is depicted that includes an LDPC decoder with dynamic graph modification 432 in accordance with some embodiments of the present inventions. The read channel 400 processes an analog signal 402 to retrieve user data bits from the analog signal 402 without errors. In some cases, analog signal 402 is derived from a read/write head assembly in a magnetic storage medium. In other cases, analog signal 402 is derived from a receiver circuit that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog signal 402 may be derived.

The read channel 400 includes an analog front end 404 that receives and processes the analog signal 402. Analog front end 404 may include, but is not limited to, an analog filter and an amplifier circuit as are known in the art. Based upon the disclosure provided herein, one of ordinary skill in the art will recognize a variety of circuitry that may be included as part of analog front end 404. In some cases, the gain of a variable gain amplifier included as part of analog front end 404 may be modifiable, and the cutoff frequency and boost of an analog filter included in analog front end 404 may be modifiable. Analog front end 404 receives and processes the analog signal 402, and provides a processed analog signal 406 to an analog to digital converter 410.

Analog to digital converter 410 converts processed analog signal 406 into a corresponding series of digital samples 412. Analog to digital converter 410 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present inventions. Digital samples 412 are provided to an equalizer 414. Equalizer 414 applies an equalization algorithm to digital samples 412 to yield an equalized output 416. In some embodiments of the present invention, equalizer 414 is a digital finite impulse response filter circuit as is known in the art. Data or codewords contained in equalized output 416 may be stored in a buffer 418 until a data detector 420 is available for processing.

The data detector 420 performs a data detection process on the received input, resulting in a detected output 422. In some embodiments of the present invention, data detector 420 is a Viterbi algorithm data detector circuit, or more particularly in some cases, a maximum a posteriori (MAP) data detector circuit as is known in the art. In these embodiments, the detected output 422 contains log-likelihood-ratio (LLR) information about the likelihood that each bit or symbol has a particular value. Based upon the disclosure provided herein, one of ordinary skill in the art will recognize a variety of data detectors that may be used in relation to different embodiments of the present invention. Data detector 420 is started based upon availability of a data set in buffer 418 from equalizer 414 or another source.

The detected output 422 from data detector 420 is provided to an interleaver 424 that protects data against burst errors. Burst errors overwrite localized groups or bunches of bits. Because LDPC decoders are best suited to correcting errors that are more uniformly distributed, burst errors can overwhelm LDPC decoders. The interleaver 424 prevents this by interleaving or shuffling the detected output 422 from data detector 420 to yield an interleaved output 426 which is stored in a memory 430. The interleaved output 426 from the memory 430 is provided to a LDPC decoder 432 which performs parity checks on the interleaved output 426, ensuring that parity constraints established by an LDPC encoder (not shown) before storage or transmission are satisfied in order to detect and correct any errors that may have occurred in the data during storage or transmission or during processing by other components of the read channel 400. As part of the decoding process, the LDPC decoder with dynamic graph modification 432 may dynamically modify the Tanner graph associated with the LDPC code, for example if a trapping set is encountered.

Multiple detection and decoding iterations may be performed in the read channel 400, both global iterations through the detector 420 and LDPC decoder 432 and local iterations within the LDPC decoder 432. To perform a global iteration, LLR values 434 from the LDPC decoder 432 are stored in memory 430, deinterleaved in a deinterleaver 436 to reverse the process applied by interleaver 424, and provided again to the data detector 420 to allow the data detector 420 to repeat the data detection process, aided by the LLR values 434 from the LDPC decoder 432. In this manner, the read channel 400 can perform multiple global iterations, allowing the data detector 420 and LDPC decoder 432 to converge on the correct data values.

The LDPC decoder 432 also produces hard decisions 440 about the values of the data bits or symbols contained in the interleaved output 426 of the interleaver 424. For binary data bits, the hard decisions may be represented as 0's and 1's. In a GF(4) LDPC decoder, the hard decisions may be represented by four field elements 00, 01, 10 and 11.

The hard decisions 440 from LDPC decoder 432 are deinterleaved in a hard decision deinterleaver 442, reversing the process applied in interleaver 424, and stored in a hard decision memory 444 before being provided to a user or further processed. For example, the output 446 of the read channel 400 may be further processed to reverse formatting changes applied before storing data in a magnetic storage medium or transmitting the data across a transmission channel.

Figure 5:
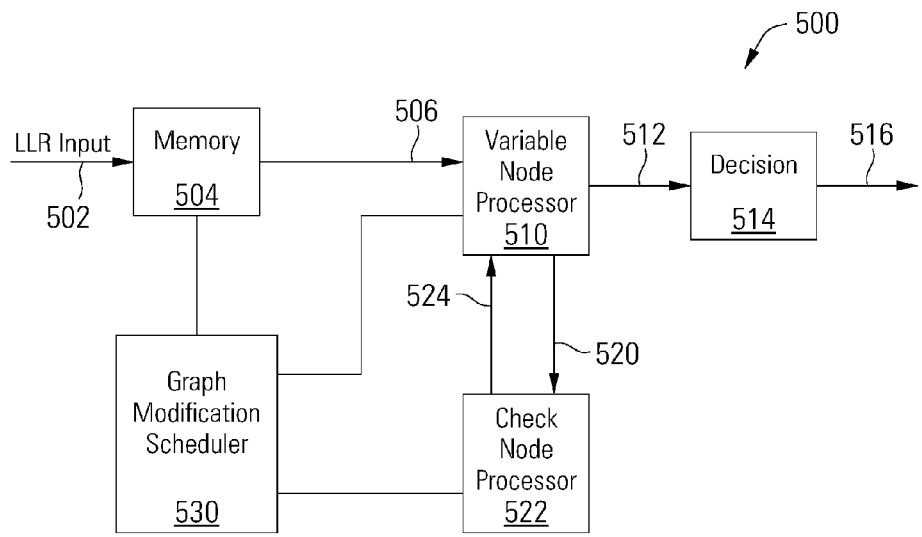
FIG. 5 depicts a block diagram of an LDPC decoder with dynamic graph modification in accordance with some embodiments of the present inventions.

Turning to FIG. 5, a block diagram of an LDPC decoder with dynamic graph modification 500 is depicted in accordance with some embodiments of the present inventions. The LDPC decoder with dynamic graph modification 500 may be a binary or multi-level decoder, layered or non-layered, and is not limited to any particular algorithm for parity check calculations or message generation techniques. Input data 502 is stored in a memory 504. Input data 502 includes LLR values in some embodiments. LLR values 506 from memory 504 are provided to a variable node processor 510, which generates V2C messages 520 containing LLR values for the perceived value of each variable node. A check node processor 522 receives the V2C messages 520 and performs parity check calculations for each check node based on messages from connected variable nodes. The check node processor 522 also generates C2V messages 524, enabling the variable node processor 510 to update the perceived value for each variable node based on C2V messages 524 from connected check nodes. Updated variable node values may also be updated in the memory 504 during local decoding iterations, either by the variable node processor 510 or check node processor 522 or both. LLR values 512 from the variable node processor 510 may also be provided to a decision circuit 514 which generates a hard decision output 516.

A graph modification scheduler 530 or graph modification circuit controls the flow of data between the memory 504, variable node processor 510 and check node processor 522, controlling local decoding iterations. The graph modification scheduler 530 also determines when a trapping set has been detected and controls or implements the dynamic graph modification. In other embodiments, the trapping set detection and/or graph modification may be performed in one or more other components of the LDPC decoder with dynamic graph modification 500.

Figure 6:
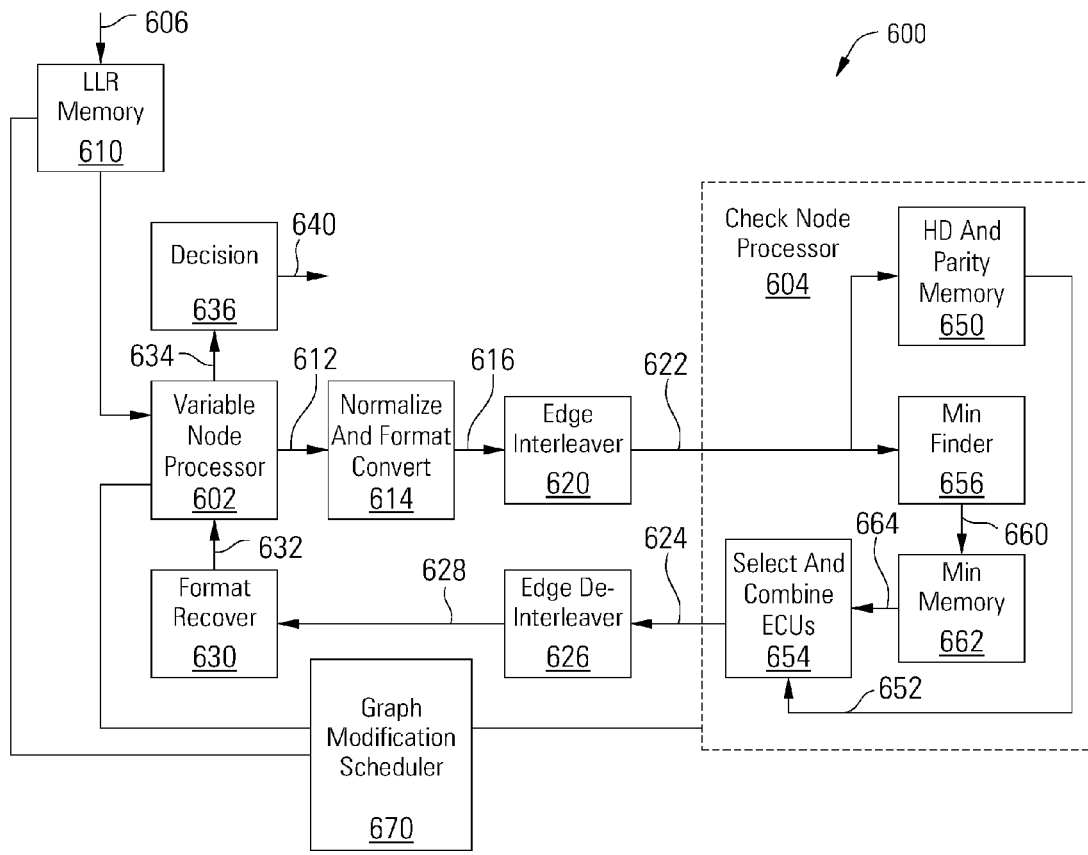
FIG. 6 depicts a block diagram of a multi-level min-sum based LDPC decoder with dynamic graph modification in accordance with some embodiments of the present inventions.

Turning to FIG. 6, in some embodiments, the LDPC decoder with dynamic graph modification is a min-sum based LDPC decoder 600 in which check nodes calculate a minimum, next minimum and hard decision value based on incoming V2C or variable node message vectors. However, it is important to note that the LDPC decoder with dynamic graph modification is not limited to the min-sum based non-binary LDPC decoder 600 of FIG. 6, but that any suitable LDPC decoder may be operable to implement the dynamic graph modification disclosed herein.

The min-sum based non-binary LDPC decoder 600 is provided with an input 606, for example containing a hard decision and corresponding LLR values, which are stored in a symbol memory 610. The input 606 is provided to the variable node processor 602 from the symbol memory 610, and the variable node processor 602 updates the perceived value of each symbol based on the value from input 606 and on C2V message vectors or check node messages from a check node processor 604. The variable node processor 602 also generates V2C message vectors 612 or variable node messages for neighboring check nodes.

Figure 1:
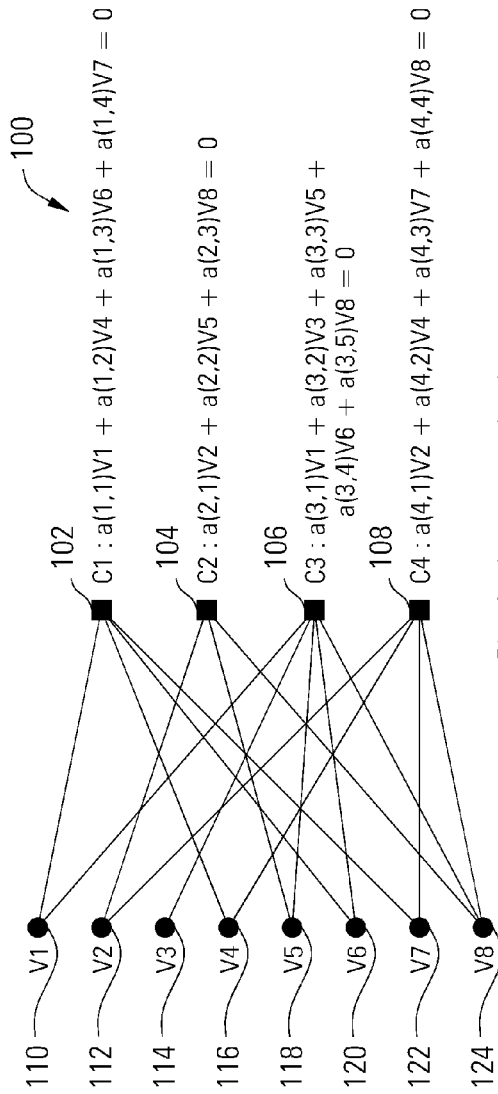
FIG. 1 depicts a Tanner graph of an example prior art LDPC code.

Check nodes (implemented in check node processor 604) in a min-sum based non-binary LDPC decoder receive incoming messages from connected or neighboring variable nodes (implemented in variable node processor 602) and generate outgoing messages to each neighboring variable node to implement the parity check matrix for the LDPC code, an example of which is graphically illustrated in the Tanner graph of FIG. 1. Incoming messages to check nodes are also referred to herein as V2C messages, indicating that they flow from variable nodes to check nodes, and outgoing messages from check nodes are also referred to herein as C2V messages, indicating that they flow from check nodes to variable nodes. The check node uses multiple V2C messages to generate an individualized C2V message with for each neighboring variable node.

In various embodiments of LDPC decoders that may be adapted to include dynamic graph modification, the variable node processor 602 and check node processor 604 may each be unitary, discrete components, or their functions may be distributed and intermixed in multiple components. The terms variable node processor and check node processor are therefore not limited to two discrete processing components, but apply generally to any components or combinations of components in an LDPC decoder that update variable node values and generate variable node to check node messages for variable node processing, and that perform check node constraint calculations and generate check node to variable node messages for check node processing.

Both V2C and C2V messages in this embodiment are vectors, each including a number of sub-messages with LLR values. Each V2C message vector from a particular variable node contains sub-messages corresponding to each symbol in the Galois Field, with each sub-message giving the likelihood that the variable node contains that particular symbol. For example, given a Galois Field GF(q) with q elements, V2C and C2V messages will include at least q sub-messages representing the likelihood for each symbol in the field.

Generally, the C2V vector message from a check node to a variable node contains the probabilities for each symbol d in the Galois Field that the destination variable node contains that symbol d, based on the prior round V2C messages from neighboring variable nodes other than the destination variable node. The inputs from neighboring variable nodes used in a check node to generate the C2V message for a particular neighboring variable node are referred to as extrinsic inputs and include the prior round V2C messages from all neighboring variable nodes except the particular neighboring variable node for which the C2V message is being prepared, in order to avoid positive feedback. The check node thus prepares a different C2V message for each neighboring variable node, using the different set of extrinsic inputs for each message based on the destination variable node.

In the min-sum based decoding disclosed herein, the check nodes calculate the minimum sub-message $min_1(d)$, the index $idx(d)$ of $min_1(d)$, and the sub-minimum sub-message $min_2(d)$, or minimum of all sub-messages excluding $min_1(d)$, for each nonzero symbol d in the Galois Field based on all extrinsic V2C messages from neighboring variable nodes. In other words, the sub-messages for a particular symbol d are gathered from messages from all extrinsic inputs, and the $min_1(d)$, $idx(d)$ and $min_2(d)$ is calculated based on the gathered sub-messages for that symbol d. For a Galois Field with q symbols, the check node will calculate the $min_1(d)$, $idx(d)$ and $min_2(d)$ sub-message for each of the q−1 non-zero symbols in the field except the most likely symbol.

The V2C message vectors 612 from the variable node processor 602 are provided to a message format converter 614 which converts the format of V2C message vectors 612 to a format consisting of two parts, the most likely symbol, and the LLR of other symbols, normalized to the most likely symbol, yielding normalized V2C message vectors 616 in the second format. Message normalization in the message format converter 614 is performed with respect to the most likely symbol. Thus, the V2C and C2V vector format includes two parts, an identification of the most likely symbol and the LLR for the other q−1 symbols, since the most likely symbol has LLR equal to 0 after normalization. The normalized V2C message vectors 616 are provided to an edge interleaver 620 which shuffles messages on the boundaries at message edges, randomizing noise and breaking dependencies between messages. The interleaved normalized V2C message vectors 622 are provided to the check node processor 604, which generates C2V messages 624 for each neighboring variable node processor based on extrinsic V2C messages from other neighboring variable node processors.

The C2V messages 624 are provided to an edge de-interleaver 626, which reverses the process of the edge interleaver 620, and then to a format recovery circuit 630, which converts message vectors from the second, normalized format to the first message vector format of the variable node processor 602, reversing the process of the message format converter 614. The resulting first format C2V messages 632 are provided to the variable node processor 602 for use in updating perceived LLR values in variable nodes. In other embodiments, the variable node processor 602 is adapted to operate directly with message vectors of the second, normalized format. In these embodiments, the message format converter 614 and format recovery circuit 630 are omitted.

When the values in the min-sum based non-binary LDPC decoder 600 converge and stabilize, or when a limit is reached on the number of local iterations, the variable node processor 602 provides the total LLR $S_n(a)$ 634 to a decision circuit 636 to generate a hard decision 640 based on the $argmin_a$ of the total LLR $S_n(a)$.

The check node processor 604 includes a hard decision and parity memory circuit 650 that processes the interleaved normalized V2C message vectors 622 to provide the most likely symbol 652 to a select and combine circuit 654 having a number of elementary computation units (ECUs). The check node processor 604 also includes a min finder 656 that calculates the $min_1$), $idx(d)$ and $min_2(d)$ sub-messages 660 for each of the q symbols in the Galois Field and stores them in a min memory 662. The stored $min_1(d)$, $idx(d)$ and $min_2(d)$ sub-messages 664 are provided by min memory 662 to the select and combine circuit 654. The select and combine circuit 654 combines the $min_1(d)$, $idx(d)$ and $min_2(d)$ sub-messages 664 and the most likely symbol 652 to generate the C2V messages 624.

The message vector format conversion performed by message format converter 614 on V2C message vectors 612 is reversed by format recovery circuit 630, providing C2V messages 632 to variable node processor 602 in the format used by the variable node processor 602.

A graph modification scheduler 670 in the min-sum based non-binary LDPC decoder 600 controls the flow of data between the memory 610, variable node processor 602 and check node processor 604, controlling local decoding iterations. The graph modification scheduler 670 also determines when a trapping set has been detected and controls or implements the dynamic graph modification. In other embodiments, the trapping set detection and/or graph modification may be performed in one or more other components of the LDPC decoder with dynamic graph modification 600.

Figure 7:
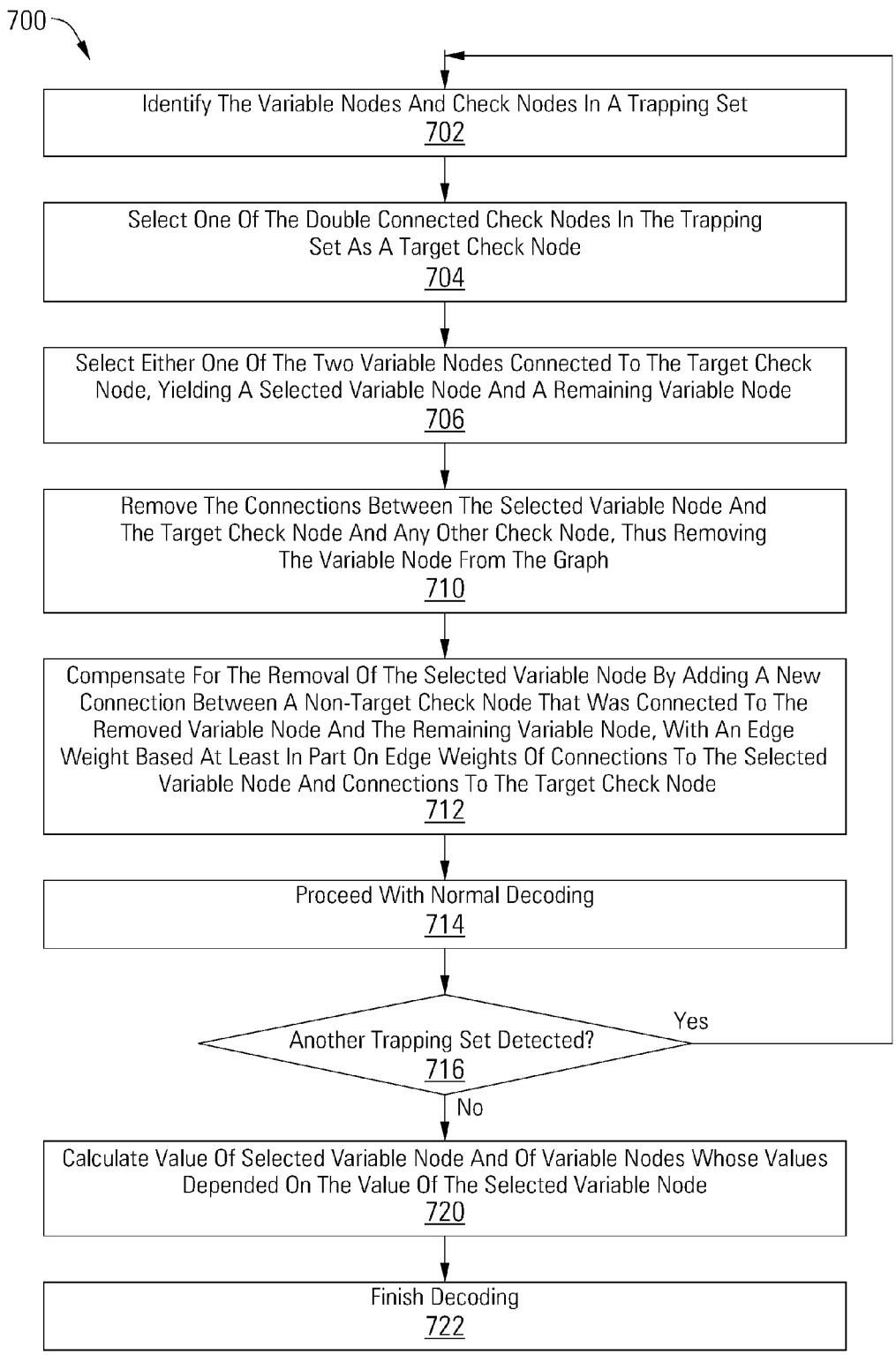
FIG. 7 depicts a flow diagram of an LDPC decoding operation with dynamic graph modification in accordance with some embodiments of the present inventions.

Turning to FIG. 7, a flow diagram 700 is depicted of a dynamic graph modification operation that may take place during a decoding operation in an LDPC decoder in accordance with various embodiments of the present inventions. Following flow diagram 700, the variable nodes and check nodes in a trapping set are identified (block 702). Variable nodes connected to single-edge check nodes in the trapping set may first be removed by setting the value of those variable nodes to a predetermined value, such as zero, and removing the connections to the single-edge check nodes. One of the double connected check nodes in the trapping set is selected (block 704) as a target check node. Either of the two variable nodes connected to the target check node is selected (block 706), yielding a selected variable node and a remaining variable node. The connections between the selected variable node and the target check node and any other check node are removed (block 710), thus removing the selected variable node from the graph. The removal of the selected variable node is compensated for (block 712) by adding a new connection between a non-target check node that was connected to the removed variable node and the remaining variable node, with an edge weight based at least in part on edge weights of connections to the selected variable node and connections to the target check node. For example, in a binary LDPC decoder, the edge-weight e of the connection between the non-target check node and the remaining variable node is e=b*c/a, where b is the edge weight between the remaining variable node and the target check node, c is the edge weight between the selected variable node and the non-target check node, and a is the edge weight between the selected variable node and the target check node. Normal decoding is continued (block 714). A determination is made (block 714) as to whether another trapping set is detected during normal decoding. If so, the graph modification operation is repeated (block 702). Otherwise, the value of selected variable node and of variable nodes whose values depended on the value of the selected variable node is calculated (block 720). Decoding is then finished (block 722) when the data has converged or when the maximum number of local decoding iterations has been reached.

Figure 8:
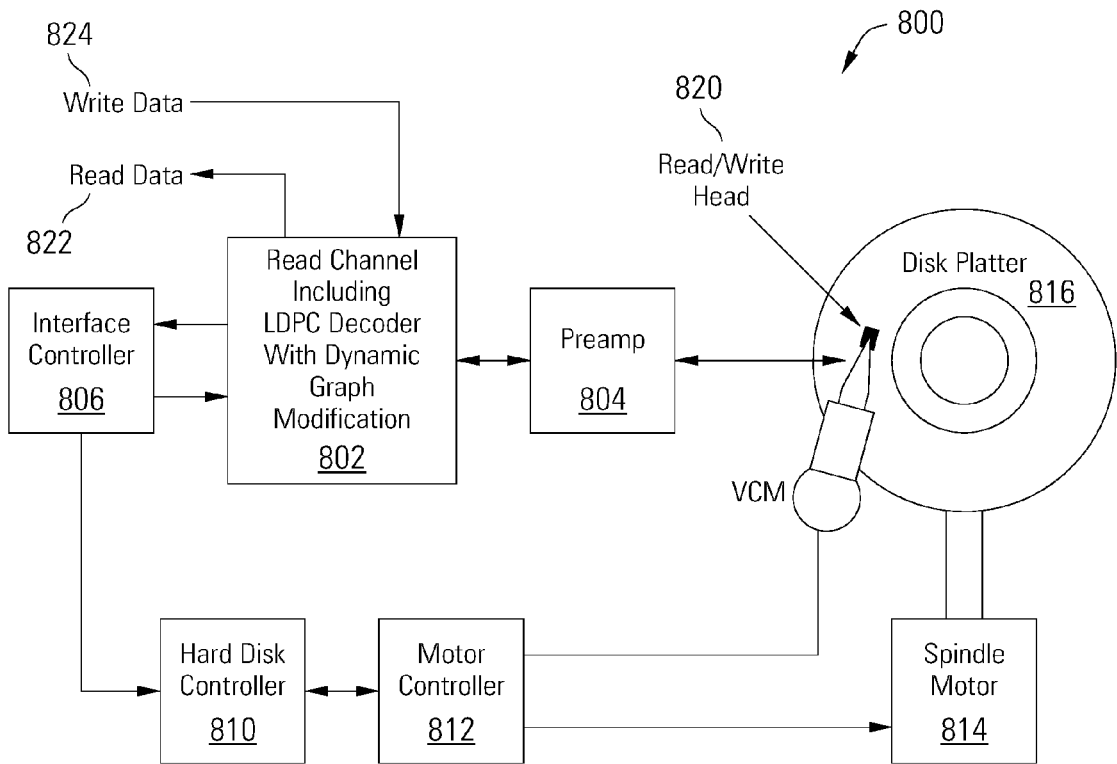
FIG. 8 depicts a storage system including a data processing circuit with an LDPC decoder with dynamic graph modification in accordance with some embodiments of the present inventions.
Figure 9:
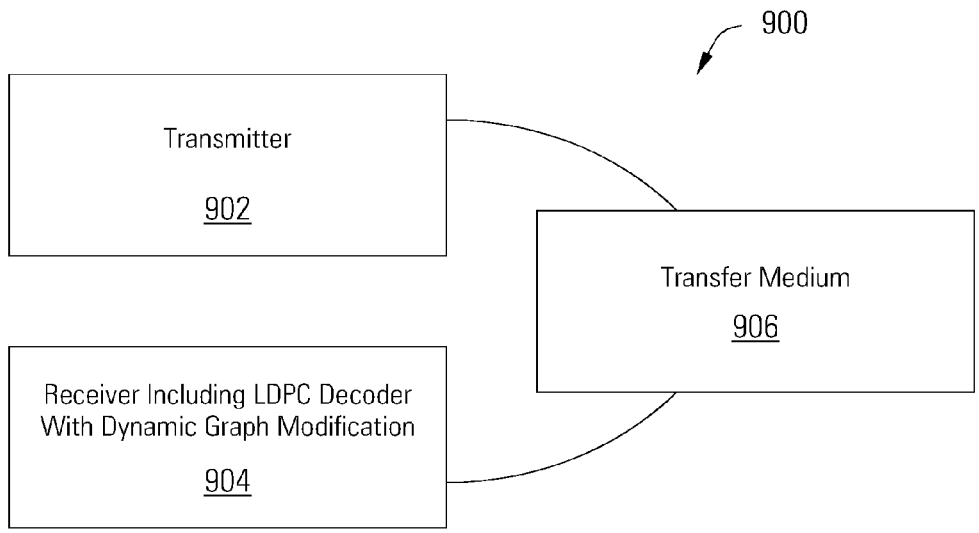
FIG. 9 depicts a wireless communication system including a data processing circuit with an LDPC decoder with dynamic graph modification in accordance with some embodiments of the present inventions.

Although the LDPC decoder trapping set identification disclosed herein is not limited to any particular application, several examples of applications are presented in FIGS. 8 and 9 that benefit from embodiments of the present inventions. Turning to FIG. 8, a storage system 800 including a read channel circuit 802 having an LDPC decoder with dynamic graph modification is shown in accordance with some embodiments of the present inventions. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. As part of decoding the received information, read channel circuit 802 processes the received signal using an LDPC decoder with dynamic graph modification. Such an LDPC decoder with dynamic graph modification may be implemented consistent with that disclosed above in relation to FIGS. 3-6. In some cases, LDPC decoding with dynamic graph modification may be performed consistent with the flow diagram disclosed above in relation to FIG. 7. A write operation is substantially the opposite of the preceding read operation with write data 824 being provided to read channel circuit 802. This data is then encoded and written to disk platter 816. It should be noted that various functions or blocks of storage system 800 may be implemented in either software or firmware, while other functions or blocks are implemented in hardware.

Storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 9, a data transmission system 900 including a receiver 904 having an LDPC decoder with dynamic graph modification is shown in accordance with various embodiments of the present invention. Data transmission system 900 includes a transmitter 902 that is operable to transmit encoded information via a transfer medium 906 as is known in the art. The encoded data is received from transfer medium 906 by a receiver 904. Receiver 904 processes the received input to yield the originally transmitted data. As part of processing the received information, receiver 904 decodes received data with an LDPC decoder with dynamic graph modification. Such an LDPC decoder with dynamic graph modification may be implemented consistent with that disclosed above in relation to FIGS. 3-6. In some cases, LDPC decoding with dynamic graph modification may be performed consistent with the flow diagram disclosed above in relation to FIG. 7.

It should be noted that the various blocks discussed in the above application may be implemented in integrated circuits along with other functionality. Such integrated circuits may include all of the functions of a given block, system or circuit, or a portion of the functions of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel systems, devices, methods and arrangements for an LDPC decoder with dynamic graph modification. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
    a hardware low density parity check decoder operable to iteratively generate and process check node to variable node messages and variable node to check node messages, and to dynamically modify a Tanner graph for a low density parity check code associated with the low density parity check decoder, by identifying any single-edge check nodes in the Tanner graph, setting a hard decision of variable nodes connected to the single-edge check nodes to a predetermined value, and removing connections to the single-edge check nodes, and wherein the low density parity check decoder comprises a non-erasure channel decoder, and wherein dynamically modifying the Tanner graph comprises changing at least one parity check equation associated with the Tanner graph.

2. The apparatus of claim 1, wherein the low density parity check decoder comprises a variable node processor operable to generate the variable node to check node messages, a check node processor operable to generate the check node to variable node messages, and a graph modification circuit operable to modify the Tanner graph.

3. The apparatus of claim 1, wherein the low density parity check decoder is operable to identify a subset of a plurality of variable nodes and a plurality of check nodes in the Tanner graph, wherein a portion of the Tanner graph consisting of the subset is modified by the low density parity check decoder.

4. The apparatus of claim 1, wherein the low density parity check decoder is operable to modify the Tanner graph by selecting a double-edge check node in the Tanner graph as a target check node, selecting one of two variable nodes connected to the target check node as a selected variable node and leaving another of the two variable nodes connected to the target check node as a remaining variable node, and removing connections to the selected variable node to remove the selected variable node from the Tanner graph, wherein a check node connected to the selected variable node other than the target check node is a non-target check node.

5. The apparatus of claim 4, wherein the target check node and the selected variable node are in a trapping set.

6. The apparatus of claim 4, wherein the low density parity check decoder is further operable to modify the Tanner graph by adding a new connection between the remaining variable node and the non-target check node.

7. The apparatus of claim 6, wherein the low density parity check decoder is further operable to modify the Tanner graph by assigning an edge weight to the new connection that is at least partly based on edge weights of original connections to the selected variable node and to the target check node.

8. The apparatus of claim 7, wherein the edge weight assigned to the new connection comprises an original edge weight between the remaining variable node and the target check node, multiplied by an original edge weight between the selected variable node and the non-target check node, divided by an original edge weight between the selected variable node and the target check node.

9. The apparatus of claim 1, wherein the apparatus is implemented as an integrated circuit.

10. The apparatus of claim 1, wherein the apparatus is incorporated in a storage device.

11. The apparatus of claim 10, wherein the storage device comprises a redundant array of independent disks.

12. The apparatus of claim 1, wherein the apparatus is incorporated in a transmission system.

13. A method for dynamically modifying a Tanner graph in a non-erasure channel low density parity check decoder, comprising:
selecting a double-edge check node in the Tanner graph as a target check node in a hardware low density parity check decoder;
selecting one of two variable nodes connected to the target check node as a selected variable node and leaving another of the two variable nodes connected to the target check node as a remaining variable node; and
removing connections to the selected variable node to remove the selected variable node from the Tanner graph by changing a parity check equation for the target check node, wherein a check node connected to the selected variable node other than the target check node is a non-target check node.

14. The method of claim 13, further comprising adding a new connection between the remaining variable node and the non-target check node.

15. The method of claim 14, further comprising assigning an edge weight to the new connection that is at least partly based on edge weights of original connections to the selected variable node and to the target check node.

16. The method of claim 15, wherein the edge weight assigned to the new connection comprises an original edge weight between the remaining variable node and the target check node, multiplied by an original edge weight between the selected variable node and the non-target check node, divided by an original edge weight between the selected variable node and the target check node.

17. The method of claim 16, further comprising calculating a hard decision for the selected variable node later in a decoding operation.

18. The method of claim 13, further comprising identifying any single-edge check nodes in the Tanner graph, setting a hard decision of variable nodes connected to the single-edge check nodes to a predetermined value, and removing connections to the single-edge check nodes.

19. A storage system comprising:
a storage medium maintaining a data set;
a read/write head assembly operable to sense the data set on the storage medium; and
a data processing circuit operable to correct errors in the data set, wherein the data processing circuit comprises a low density parity check decoder operable to iteratively generate and process check node to variable node messages and variable node to check node messages, and to dynamically modify a Tanner graph for a low density parity check code associated with the low density parity check decoder, by identifying any single-edge check nodes in the Tanner graph, setting a hard decision of variable nodes connected to the single-edge check nodes to a predetermined value, and removing connections to the single-edge check nodes, wherein the low density parity check decoder comprises a non-erasure channel decoder, and wherein dynamically modifying the Tanner graph comprises changing at least one parity check equation associated with the Tanner graph.

20. The storage system of claim 19, wherein the low density parity check decoder is operable to modify the Tanner graph by selecting a double-edge check node in the Tanner graph as a target check node, selecting one of two variable nodes connected to the target check node as a selected variable node and leaving another of the two variable nodes connected to the target check node as a remaining variable node, and removing connections to the selected variable node to remove the selected variable node from the Tanner graph, wherein a check node connected to the selected variable node other than the target check node is a non-target check node.

* * * * *